(12) United States Patent
Logunov et al.

(10) Patent No.: US 8,134,293 B2
(45) Date of Patent: Mar. 13, 2012

(54) SEAL FOR LIGHT EMITTING DISPLAY DEVICE, METHOD, AND APPARATUS

(75) Inventors: Stephan Lvovich Logunov, Corning, NY (US); Kamjula Pattabhirami Reddy, Corning, NY (US); Sujanto Widjaja, Corning, NY (US)

(73) Assignee: Corning Incorporated, Corning, NY (US)

( * ) Notice: Subject to any disclaimer, the term of this patent is extended or adjusted under 35 U.S.C. 154(b) by 7 days.

(21) Appl. No.: 12/857,984

(22) Filed: Aug. 17, 2010

(65) Prior Publication Data
US 2011/0001424 A1    Jan. 6, 2011

Related U.S. Application Data

(62) Division of application No. 11/593,819, filed on Nov. 7, 2006, now Pat. No. 7,800,303.

(51) Int. Cl.
*H01L 51/50* (2006.01)
*H01L 51/52* (2006.01)
*H01L 51/56* (2006.01)

(52) U.S. Cl. .......................... 313/512; 313/506; 445/25

(58) Field of Classification Search .......... 313/498–512; 445/24, 25
See application file for complete search history.

(56) References Cited

U.S. PATENT DOCUMENTS

| 7,431,628 | B2 | 10/2008 | Park et al. ......................... 445/25 |
| 2004/0207314 | A1 | 10/2004 | Aitken et al. .................. 313/504 |
| 2004/0217703 | A1 | 11/2004 | Wittmann ....................... 313/512 |
| 2005/0248270 | A1 | 11/2005 | Ghosh et al. ................... 313/512 |
| 2006/0103301 | A1 | 5/2006 | Spencer .......................... 313/512 |
| 2007/0090759 | A1 | 4/2007 | Choi et al. ...................... 313/512 |
| 2007/0096631 | A1 | 5/2007 | Sung et al. ..................... 313/498 |
| 2007/0114909 | A1 | 5/2007 | Park et al. ...................... 313/495 |
| 2007/0170324 | A1 | 7/2007 | Lee et al. ....................... 248/247 |
| 2007/0170423 | A1 | 7/2007 | Choi et al. ....................... 257/40 |
| 2007/0170455 | A1 | 7/2007 | Choi et al. ..................... 257/100 |
| 2007/0170605 | A1 | 7/2007 | Lee et al. ........................ 264/1.1 |
| 2007/0170839 | A1 | 7/2007 | Choi et al. ..................... 313/500 |
| 2007/0170845 | A1 | 7/2007 | Choi et al. ..................... 313/504 |
| 2007/0170846 | A1 | 7/2007 | Choi et al. ..................... 313/504 |
| 2007/0170849 | A1 | 7/2007 | Park ............................... 313/506 |
| 2007/0170850 | A1 | 7/2007 | Choi et al. ..................... 313/506 |
| 2007/0170854 | A1 | 7/2007 | Kwak ............................. 313/512 |
| 2007/0170855 | A1 | 7/2007 | Choi et al. ..................... 313/512 |
| 2007/0170856 | A1 | 7/2007 | Cha ................................ 313/512 |
| 2007/0170859 | A1 | 7/2007 | Choi et al. ..................... 313/512 |
| 2007/0170860 | A1 | 7/2007 | Choi et al. ..................... 313/512 |

(Continued)

FOREIGN PATENT DOCUMENTS

EP    1 681 907    7/2006

(Continued)

*Primary Examiner* — Mariceli Santiago
(74) *Attorney, Agent, or Firm* — Kevin M. Able

(57) ABSTRACT

A glass package is disclosed comprising a first substrate and a second substrate, where the substrates are attached in at least two locations, at least one attachment comprising a frit, and at least one attachment comprising a polymeric adhesive and wherein the frit comprises a glass portion comprising: a base component comprising and at least one absorbing component. Also disclosed is a method of sealing a light emitting display device comprising providing a light emitting layer, a first substrate and a second substrate, where a frit is deposited between the substrates and a polymeric adhesive is deposited either between the substrates or around the edge of the device, and where the frit is sealed with a radiation source and the polymeric adhesive is cured.

13 Claims, 2 Drawing Sheets

U.S. PATENT DOCUMENTS

| | | | |
|---|---|---|---|
| 2007/0170861 A1 | 7/2007 | Lee et al. | 313/512 |
| 2007/0171637 A1 | 7/2007 | Choi | 362/227 |
| 2007/0173167 A1 | 7/2007 | Choi | 445/25 |
| 2007/0717637 | 7/2007 | Choi | 362/227 |

FOREIGN PATENT DOCUMENTS

| | | | |
|---|---|---|---|
| EP | 1 811 589 | | 1/2007 |
| JP | 56168632 A | * | 12/1981 |
| JP | 10214580 A | | 8/1998 |
| JP | 11249107 A | * | 9/1999 |
| JP | 2002280169 A | * | 9/2002 |
| JP | 2004319103 A | | 11/2004 |
| WO | WO 01/49621 | | 7/2001 |
| WO | WO 2005/050751 | | 6/2005 |
| WO | WO 2006/044383 | | 4/2006 |
| WO | WO 2007/067402 | | 6/2007 |

* cited by examiner

SEAL FOR LIGHT EMITTING DISPLAY DEVICE, METHOD, AND APPARATUS

This application is a divisional application of application Ser. No. 11/593819, filed Nov. 7, 2006 now U.S. Pat. No. 7,800,303, the content of which is relied upon and incorporated herein by reference in its entirety, and the benefit of priority under 35 U.S.C. §120 is hereby claimed.

BACKGROUND OF THE INVENTION

Field of the Invention

The present invention relates to hermetically sealed glass packages that are suitable to protect thin film devices that are sensitive to the ambient environment.

Technical Background

Light emitting devices have been the subject of considerable research in recent years. Organic light emitting devices (OLED) are of particular interest because of their use and potential use in ac wide variety of electroluminescent devices. A single OLED, for example, can be used in a discrete light emitting device, or an array of OLEDs can be used in lighting applications or flat-panel display applications, such as OLED displays. Traditional OLED displays are known as being very bright and having a good color contrast and wide viewing angle. However, traditional OLED displays and in particular the electrodes and organic layers located therein are susceptible to degradation resulting from interaction with oxygen and moisture leaking into an OLED display from the ambient environment. It is well known that the life of an OLED display can be significantly increased if the electrodes and organic layers within an OLED display are hermetically sealed from the ambient environment. Unfortunately, it has historically been very difficult to develop a sealing process to hermetically seal a light emitting display.

Some of the factors that made it difficult to properly seal a light emitting display are briefly mentioned below:

The hermetic seal should provide a barrier for oxygen and water.

The width of the hermetic seal should be minimal so that it does not have an adverse effect on size of a light emitting display.

The temperature generated during the sealing process should be sufficiently low as to not damage the materials, for example, electrodes and organic layers, within a light emitting display.

The gases released during the sealing process, if any, should be compatible with the materials within a light emitting display.

The hermetic seal should enable electrical connections, for example, thin-film chromium, to enter a light emitting display.

There is a need to address the aforementioned problems and other shortcomings associated with the traditional seals and the traditional approaches for sealing light emitting displays. These needs and other needs are satisfied by the hermetic sealing technology of the present invention.

SUMMARY OF THE INVENTION

The present invention relates to a glass package, and more particularly to a frit and polymeric adhesive composition for use in sealing a glass package, such as a light emitting device.

In a first aspect, the present invention provides a glass package comprising: a first substrate, a second substrate, a frit coupling the first substrate and the second substrate, and a polymeric adhesive further coupling the first substrate and the second substrate, wherein at least a portion of the first substrate is in overlying registration to at least a portion of the second substrate; and wherein the frit comprises: a glass portion comprising: a base component comprising: from about 5 to about 75 mole % $SiO_2$; from about 10 to about 40 mole % $B_2O_3$; from 0 to about 20 mole % $Al_2O_3$; and at least one absorbing component comprising: from greater than 0 to about 25 mole % CuO; or from greater than 0 to about 7 mole % $Fe_2O_3$; from greater than 0 to about 10 mole % $V_2O_5$; and from 0 to about 5 mole % $TiO_2$.

In a second aspect, the present invention provides a glass package comprising: a first substrate, a second substrate, a frit coupling the first substrate and the second substrate, and a polymeric adhesive further coupling the first substrate and the second substrate, wherein at least a portion of the first substrate is in overlying registration with at least a portion of the second substrate; and wherein the frit is made from glass doped with at least one transition metal and the frit does not comprise a coefficient of thermal expansion matching filler.

In a third aspect, the present invention provides a method of sealing a light emitting display device comprising providing a light emitting layer, a first substrate and a second substrate, each substrate having an inner surface and an outer surface; depositing a glass frit composition around the perimeter of the inner surface of the first substrate; depositing a polymeric adhesive on the inner surface of at least one of the first or second substrate; joining the inner surfaces of the first substrate and the second substrate so that the light emitting layer is positioned between the first and second substrates, and so that at least a portion of the first substrate is in overlying registration with at least a portion of the second substrate; heating the glass frit composition until a hermetic seal is formed; and curing the polymer adhesive layer; wherein the heating and curing steps may be performed in any order.

In a fourth aspect, the present invention provides a method of sealing a light emitting display device comprising: providing a light emitting layer, a first substrate and a second substrate, each substrate having an inner surface and an outer surface; depositing a glass frit composition around the perimeter of the inner surface of the first substrate; joining the inner surfaces of the first substrate and the second substrate so that at least a portion of the first substrate is in overlying registration with at least a portion of the second substrate and so that the light emitting layer is positioned between the first and second substrate, thereby creating a joined first and second substrate; depositing a polymeric adhesive around the perimeter of the joined first and second substrates; heating the glass frit composition until a hermetic seal is formed; and curing the polymer adhesive layer; wherein the heating and curing steps may be performed in any order.

Additional aspects and advantages of the invention will be set forth, in part, in the detailed description, figures, and any claims which follow, and in part will be derived from the detailed description or can be learned by practice of the invention. The advantages described below will be realized and attained by means of the elements and combinations particularly pointed out in the appended claims. It is to be understood that both the foregoing general description and the following detailed description are exemplary and explanatory only and are not restrictive of the invention as disclosed.

BRIEF DESCRIPTION OF THE DRAWINGS

The accompanying drawings, which are incorporated in and constitute a part of this specification, illustrate certain aspects of the present invention and together with the description, serve to explain, without limitation, the principles of the invention. Like numbers represent the same elements throughout the figures.

DETAILED DESCRIPTION OF THE INVENTION

Figure 1:
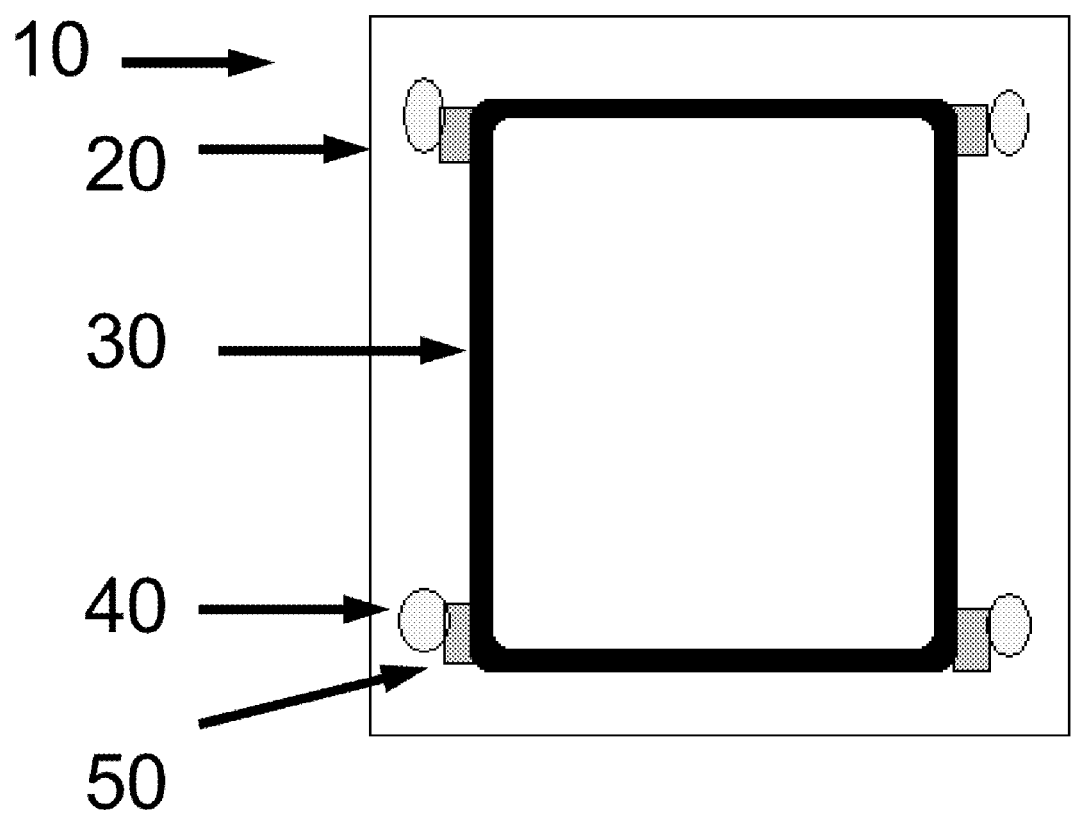
FIG. 1 is an illustration of an OLED device comprising a hermetic frit seal and a selective reinforcing epoxy seal in accordance with one aspect of the present invention.

The present invention can be understood more readily by reference to the following detailed description, drawings, examples, and claims, and their previous and following description. However, before the present compositions, articles, devices, and methods are disclosed and described, it is to be understood that this invention is not limited to the specific compositions, articles, devices, and methods disclosed unless otherwise specified, as such can, of course, vary. It is also to be understood that the terminology used herein is for the purpose of describing particular aspects only and is not intended to be limiting.

The following description of the invention is provided as an enabling teaching of the invention in its currently known embodiments. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof.

Disclosed are materials, compounds, compositions, and components that can be used for, can be used in conjunction with, can be used in preparation for, or are products of the disclosed method and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein. Thus, if a class of substituents A, B, and C are disclosed as well as a class of substituents D, E, and F and an example of a combination embodiment, A-D is disclosed, then even if each is not individually recited, each is individually and collectively contemplated. Thus, in this example, each of the combinations A-E, A-F, B-D, B-E, B-F, C-D, C-E, and C-F are specifically contemplated and should be considered disclosed from disclosure of A, B, and C; D, E, and F; and the example combination A-D. Likewise, any subset or combination of these is also specifically contemplated and disclosed. Thus, for example, the sub-group of A-E, B-F, and C-E are specifically contemplated and should be considered disclosed from disclosure of A, B, and C; D, E, and F; and the example combination A-D. This concept applies to all aspects of this disclosure including, but not limited to components of the compositions and steps in methods of making and using the disclosed compositions. Thus, if there are a variety of additional steps that can be performed it is understood that each of these additional steps can be performed with any specific embodiment or combination of embodiments of the disclosed methods, and that each such combination is specifically contemplated and should be considered disclosed.

In this specification and in the claims which follow, reference will be made to a number of terms which shall be defined to have the following meanings:

As used herein, the singular forms "a," "an" and "the" include plural referents unless the context clearly dictates otherwise. Thus, for example, reference to a "component" includes aspects having two or more such components, unless the context clearly indicates otherwise.

"Optional" or "optionally" means that the subsequently described event or circumstance can or cannot occur, and that the description includes instances where the event or circumstance occurs and instances where it does not. For example, the phrase "optionally substituted component" means that the component can or can not be substituted and that the description includes both unsubstituted and substituted aspects of the invention.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, a "wt. %" or "weight percent" or "percent by weight" of a component, unless specifically stated to the contrary, refers to the ratio of the weight of the component to the total weight of the composition in which the component is included, expressed as a percentage.

As used herein, a "mole percent" or "mole %" of a component, unless specifically stated to the contrary, refers to the ratio of the number of moles of the component to the total number of moles of the glass portion of the frit composition in which the component is included, on an oxide basis and expressed as a percentage.

As used herein, a "frit" or "frit composition," unless specifically stated to the contrary, refers to an oxide or a mixture of oxide components, and optionally filler. The term "frit" or "frit composition" can refer to any physical form of a frit, including a powder, a paste, an extruded bead, and can also refer to an attached or unattached frit deposited on a substrate.

As used herein, a "loop", in reference to the frit or adhesive location, refers to a line of a material that forms a bounded region. The loop line can, for example, intersect with one or more portions of the line forming the bounded region, or can be a continuous line having no beginning or end and also forming a bounded region. A loop can have curved portions, straight portions, and/or corners, and no specific geometry is intended.

As used herein, a "perimeter" can refer to either the outer edge of a device or a location at or near the outer edge of a device. For example, a material positioned around the perimeter of a substrate can mean that the material is positioned either on the edge of the substrate or on a surface of the substrate at or near the edge.

The following US Patents and published applications describe various compositions and methods for sealing light emitting devices, and they are hereby incorporated by reference in their entirety and for the specific purpose of disclosing materials and methods relating to the formation of hermetic seals with light emitting devices: U.S. Pat. No. 6,998,776; US Patent Publication US2005/0001545; and US Patent Publication 2006/0009109.

As briefly introduced above, the present invention provides an improved light emitting device. Among other aspects described in detail below, the inventive device comprises the use of a frit and a polymeric adhesive to provide a mechanically strong, hermetic seal between two substrates of the device. In one aspect, a light emitting display device is sealed by at least one frit and at least one polymer adhesive. The frit seal of the present invention should be distinguished from a direct glass seal that does not utilize a frit.

There are several considerations which should be kept in mind when designing a sealing system that can be used to make a hermetically sealed light emitting display. Following is a list of some of these considerations:

Sealing temperature—To avoid thermal degradation of the light emitting materials, such as an OLED, the device should seal at a temperature sufficiently low that the temperature experienced a short distance (1-3 mm) from the sealed edge in the light emitting display should not exceed approximately 100° C.

Expansion compatibility—The coefficient of thermal expansion (CTE) of the seal components, including the frit, should be substantially matched with that of the substrates to limit sealing stresses and thereby eliminate hermeticity loss by fractures in the seal.

Hermeticity—The seal should be hermetic and provide long-term protection for the materials in the light emitting display.

Mechanical Strength—The seal should provide mechanical strength sufficient to maintain the hermetic seal over the life of the glass package or device.

The requirement that a sealing system be accompanied by only a minimal temperature rise in the adjacent light emitting materials can be satisfied with the seal and sealing methods of the present invention.

Device

The device of the present invention can be any such device requiring two substrates to be sealed together. In one aspect, the substrates of the device are sealed together such that at least a portion of one substrate is in overlying registration with at least a portion of the second substrate. In another aspect, the device is a glass package in which two substrates are sealed together. In another aspect, the device is a light emitting display, such as a polymer light emitting device (PLED). In a preferred aspect, the device is an OLED, such as an active or passive OLED display. Although the sealing process of the present invention is described below with respect to the fabrication of a hermetically sealed OLED display, it should be understood that the same or similar sealing process can be used in other applications where two substrates need to be sealed to one another. Accordingly, the present invention should not be construed in a limited manner.

FIG. 1 depicts an exemplary top view illustrating the basic components of an OLED display 10 sealed in accordance with one aspect of the present invention. The OLED display 10 includes a substrate 20, a sealed frit 30, at least one portion of polymeric adhesive 40, and at least one portion of unsealed frit 50. The OLED is typically located within a hermetic seal formed by a frit loop. The manner in which the hermetic seal is formed from the frit and the ancillary components, such as the radiation source used to form the hermetic seal, are described in greater detail below.

Substrate

The first and second substrates of the present invention can comprise any material appropriate for the type of device being fabricated. In various aspects, at least one substrate comprises a borosilicate glass, a soda-lime glass, or a mixture thereof. In one aspect, at least one substrate is a transparent glass. Such transparent glasses can be, for example, those manufactured and sold by Corning Incorporated (Corning, N.Y., USA) under the brand names of Code 1737 glass, Eagle$^{2000}$™, and Eagle XG™; Asahi Glass Co., LTD (Tokyo, Japan), for example OA10 glass and OA21 glass; Nippon Electric Glass Co., LTD (Otsu, Shiga, Japan); NH Techno Glass Korea Corporation (Kyunggi-do, Korea); and Samsung Corning Precision Glass Co. (Seoul, Korea). It is not necessary that the first and second substrates be the same or comprise the same type of glass. In one aspect they are similar or identical types of glasses. In a preferred aspect, both the first and second substrates comprise a borosilicate glass, such as Eagle XG™.

The dimensions of the substrates can be any such dimensions suitable for the device being fabricated. In one aspect, at least one substrate is about 0.6 mm thick.

Other properties of the substrates will vary depending upon the specific composition thereof. In one aspect, the substrates of the present invention have a CTE of from about $25 \times 10^{-7}$/° C. to about $80 \times 10^{-7}$/° C. In another aspect, the softening temperature of the substrates is from about 700° C. to about 990° C.

In a preferred aspect, the substrates of the present invention are comprised of material transparent to radiation at the wavelength of the radiation source used to seal the device.

Frit

The frit of the present invention can comprise a combination of glass and/or doped glass materials capable of forming a hermetic seal between two substrates. The frit of the present invention should be capable of absorbing radiation and can have a CTE substantially similar to that of the substrates. In one aspect, the frit absorbs a larger amount of radiation at a particular wavelength, for example at 810 nanometers, than the first and second substrates. In another aspect, the frit has a softening temperature equal to or lower than the first and second substrates. In another aspect, the frit is durable upon exposure to chemicals and water. In yet another aspect, the frit is capable of bonding to both the first and the second substrates. In still another aspect, the frit is capable of sealing around electrical connections passing through the device. In another aspect, the frit is a dense material exhibiting very low porosity, for example, less than about 10 volume percent. In another aspect, the frit is substantially free of heavy metals, such as lead and cadmium. In this aspect, the heavy metals, such as the lead and cadmium, should be minimized, typically to levels below 1 mole %, preferably below 0.1 mole %, for each heavy metal component.

In one aspect, the frit comprises a glass portion; optionally a softening temperature, CTE, and/or absorbance adjusting filler; and optionally a paste binder and/or paste filler, as discussed below. In one aspect, the frit comprises a CTE matching filler, such as a β-eucryptite. In another aspect, the frit does not comprise a CTE matching filler. In another aspect, the frit comprises a glass doped with at least one transition metal and does not comprise a coefficient of thermal expansion matching filler. In one specific aspect, the frit comprises an antimony vanadium phosphate glass. In another specific aspect, the frit comprises a borosilicate glass. The frit can exist in a variety of physical forms, including a powder, a paste, and/or an extruded bead.

I. Antimony Vanadium Phosphate Based Frits

In one aspect, the glass portion of the frit is disclosed in U.S. Pat. No. 6,998,776; US Patent Publication US2005/0001545; and US Patent Publication 2006/0009109, which are hereby incorporated by reference in their entirety and for the specific purpose of disclosing frit compositions. In this aspect, the glass portion of the frit comprises from 0 to 10 mole percent potassium oxide, from 0 to 20 mole percent ferric oxide, from 0 to 40 mole percent antimony oxide, from 20 to 40 mole percent phosphorous pentoxide, from 30 to 60 mole percent vanadium pentoxide, from 0 to 20 mole percent titanium dioxide, from 0 to 5 mole percent aluminum oxide, from 0 to 5 mole percent boron oxide, from 0 to 5 mole percent tungsten oxide, and from 0 to 5 mole percent bismuth oxide.

In another aspect, the glass portion of the frit comprises from 0 to 10 mole percent potassium oxide, from 0 to 20 mole percent ferric oxide, from 0 to 20 mole percent antimony oxide, from 20 to 40 mole percent phosphorous pentoxide, from 30 to 60 mole percent vanadium pentoxide, from 0 to 20 mole percent titanium dioxide, from 0 to 5 mole percent aluminum oxide, from 0 to 5 mole percent boron oxide, from 0 to 5 mole percent tungsten oxide, from 0 to 5 mole percent bismuth oxide; and from 0 to 20 mole percent zinc oxide.

The ranges for each compound in the glass portion of the frit are summarized in Table 1 below. Exemplary aspects detailing particular ranges and combinations are described below.

TABLE 1

| Compound | Mole % Range |
| --- | --- |
| Potassium Oxide | 0-10 |
| Ferric Oxide | 0-20 |
| Antimony Oxide | 0-40 |
| Phosphorous Pentoxide | 20-40 |
| Vanadium Pentoxide | 30-60 |
| Titanium Dioxide | 0-20 |
| Aluminum Oxide | 0-5 |
| Boron Oxide | 0-5 |
| Tungsten Oxide | 0-5 |
| Bismuth Oxide | 0-5 |
| Zinc Oxide | 0-20 |

In one aspect, the amount of potassium oxide in the glass portion of the frit comprises from 0 to 10 mole percent, for example, 0, 1, 2, 4, 6, 8, 9, or 10 mole percent. in another aspect, the amount of ferric oxide in the glass portion of the frit comprises from 0 to 20 mole percent, for example, 0, 1, 2, 4, 6, 8, 10, 14, 16, 18, 19, or 20 mole percent. In another aspect, the amount of antimony oxide in the glass portion of the frit comprises from 0 to 40 mole percent, for example, 0, 1, 2, 4, 6, 10, 15, 20, 25, 30, 35, 39, or 40 mole percent; or from 0 to 20 mole percent. In another aspect; the amount of phosphorous pentoxide in the glass portion of the frit comprises from 20 to 40 mole percent, for example, 20, 21, 22, 23, 24, 25, 30, 35, 39, or 40 mole percent. In another aspect, the amount of vanadium pentoxide in the glass portion of the frit comprises from 30 to 60 mole percent, for example, 30, 31, 32, 33, 35, 40, 45, 50, 55, 58, 59, or 60 mole percent. In another aspect, the amount of aluminum oxide in the glass portion of the frit comprises from 0 to 5 mole percent, for example, 0, 0.5, 1, 2, 3, 4, or 5 mole percent. In another aspect, the amount of boron oxide in the glass portion of the frit comprises from 0 to 5 mole percent, for example 0, 0.5, 1, 2, 3, 4, or 5 mole percent. In another aspect, the amount of tungsten oxide in the glass portion of the frit comprises from 0 to 5 mole percent , for example, 0, 0.5, 1, 2, 3, 4, or 5 mole percent. In another aspect, the amount of bismuth oxide in the glass portion of the frit comprises from 0 to 5 mole percent, for example, 0, 0.5, 1, 2, 3, 4, or 5 mole percent.

II. Borosilicate Based Frits

In one aspect, the glass portion of the frit comprises a base component and at least one absorbing component. The base component of the glass portion of the frit comprises silicon dioxide, boron oxide, and optionally aluminum oxide. The absorbing component of the glass portion of the frit comprises (a) a cupric oxide and/or (b) a combination of ferric oxide, vanadium pentoxide, and optionally titanium dioxide. Thus, the glass portion of the frit comprises silicon dioxide, boron oxide, and optionally aluminum oxide, together with (a) cupric oxide and/or (b) a combination of ferric oxide, vanadium oxide, and optionally titanium dioxide. Among other aspects described in detail below, the frit composition comprises from about 5 to about 75 mole percent silicon dioxide, from about 10 to about 40 mole percent boron oxide, from 0 to about 20 mole percent aluminum oxide, and at least one of the following: a) from greater than 0 to about 25 mole percent cupric oxide; or b) from greater than 0 to about 7 mole percent ferric oxide, from greater than 0 to about 10 mole percent vanadium pentoxide, and from 0 to about 5 mole percent titanium dioxide.

The ranges for each compound in the base and absorbing components of a borosilicate based frit are summarized in Table 2 below. Exemplary aspects detailing particular ranges and combinations are described below.

TABLE 2

| Compound | Mole % Range |
| --- | --- |
| Silicon Dioxide | 5-75 |
| Boron Oxide | 10-40 |
| Aluminum Oxide | 0-20 |
| Zinc Oxide | 0-60 |
| Cupric Oxide | 0-25 |
| Ferric Oxide | 0-7 |
| Vanadium Pentoxide | 0-10 |
| Titanium Dioxide | 0-5 |

In various aspects, the amount of silicon dioxide in the glass portion of the fit comprises from about 5 to about 75 mole percent, for example, 5, 6, 7, 10, 20, 40, 50, 54, 56, 58, 60, 64, 68, 70, 72, 73, 74, or 75 mole percent; from about 50 to about 75 mole percent or from about 54 to about 70 mole percent. In a further aspect, a portion of silicon dioxide, for example, up to about 55 mole percent, and optionally at least a portion of other components, can be replaced with up to about 60 mole percent zinc oxide. Thus, the zinc oxide is considered, when present, to be part of the base component. In other aspects, the amount of zinc oxide in the glass portion of the frit comprises from about 0.1 to about 60 mole percent; from about 5 to about 55 mole percent; or from about 40 to about 55 mole percent. Zinc oxide can be used to soften a glass frit composition without adversely affecting the CTE. In a further aspect, the glass portion of the frit comprises from about 5 to about 30 mole percent silicon dioxide, from about 10 to about 40 percent boron oxide, from 0 to about 10 mole percent aluminum oxide, and from about 30 to about 60 mole percent zinc oxide. In a further aspect, the glass portion of the frit comprises from about 8 to about 15 mole percent silicon dioxide, from about 25 to about 35 mole percent boron oxide, from about 0 to about 10 mole percent aluminum oxide, and from about 40 to about 55 mole percent zinc oxide.

In various aspects, the amount of boron oxide in the glass portion of the frit comprises from about 10 to about 40 mole percent, for example 10, 11, 12, 15, 19, 20.5, 22.5, 24, 25, 30, 35, or 40 mole percent; from about 15 to about 30 mole percent; or from about 19 to about 24 mole percent.

In various aspects, the amount of aluminum oxide in the glass portion of the frit comprises from 0 to about 20 mole percent, for example, 0, 0.1, 1, 2, 4, 7, 8, 9, 10, 14, 16, 19, or 20 mole percent; from 0 to about 10 mole percent; or from about 1 to about 8 mole percent.

In various aspects, the amount of cupric oxide in the glass portion of the frit comprises from greater than 0 to about 25 mole percent, for example, 0.1, 0.5, 1, 2, 4, 6, 8, 12, 14, 16, 18, 20, 22, 23, 24, or 25 mole percent; from about 4 to about 18 mole percent; from about 6 to about 16 mole percent; or from about 8 to about 14 mole percent. The addition of cupric oxide to a borosilicate glass can increase the optical absorption of the glass, for example, at 810 nanometers, and can soften the glass. In borosilicate glass comprising aluminum oxide, such softening can occur without an increase in the CTE. In further aspects, the glass portion of the frit comprises ferric oxide, vanadium pentoxide, and/or titanium dioxide, individually or in combination, together with cupric oxide in the ranges described above. For example, the glass portion of the frit can comprise from greater than 0 to about 25 mole percent cupric oxide and from 0 to about 7 mole percent ferric oxide without vanadium pentoxide and titanium dioxide.

In various aspects, the amount of ferric oxide in the glass portion of the frit comprises from greater than 0 to about 7 mole percent, for example, 0.1, 0.5, 1, 2, 3, 5, 6, or 7 mole percent; from about 0.1 to about 3 mole percent; or from about 1 to about 2 mole percent.

In various aspects, the amount of vanadium pentoxide in the glass portion of the frit comprises from greater than 0 to about 10 mole percent, for example, 0.1, 0.5, 1, 2, 5, 7, 8, 9, or 10 mole percent; from about 0.1 to about 5 mole percent; or from about 0.5 to about 2 mole percent.

In various aspects, the amount of titanium dioxide in the glass portion of the frit comprises from 0 to about 5 mole percent, for example, 0, 0.1, 0.5, 1, 2, 3, 4, or 5 mole percent; from 0 to about 2 mole percent; from 0 to about 1 mole percent; from bout 0.1 to about 2 mole percent; or from about 0.1 to about 1 mole percent.

In one aspect, the base component comprises from about 5 to about 75 mole percent silicon dioxide, from about 10 to about 40 mole percent boron oxide, and from 0 to about 20 mole percent aluminum oxide. In another aspect, the base component comprises from about 50 to about 75 mole percent silicon dioxide, from about 15 to about 30 mole percent boron oxide, and from 0 to about 10 mole percent aluminum oxide. In another aspect, the base glass comprises from about 54 to about 70 mole percent silicon dioxide, from about 19 to about 24 mole percent boron oxide, and from about 1 to about 8 mole percent aluminum oxide. In another aspect, the base glass comprises from about 56 to about 68 mole percent silicon dioxide, from about 20.5 to about 22.5 mole percent boron oxide, and from about 2 to about 7 mole percent aluminum oxide.

In a first aspect, the absorbing component comprises from greater than 0 to about 25 mole percent cupric oxide, from about 4 to about 18 mole percent cupric oxide, from about 6 to about 16 mole percent cupric oxide, or from about 8 to about 14 mole percent cupric oxide.

In a second aspect, the absorbing component comprises from greater than 0 to about 7 mole percent ferric oxide, from greater than 0 to about 10 mole percent vanadium pentoxide, and from 0 to about 5 mole percent titanium dioxide. In another aspect, the absorbing glass comprises from about 0.1 to about 3 mole percent ferric oxide, from about 0.1 to about 5 mole percent vanadium pentoxide, and from 0 to about 2 mole percent titanium dioxide. In another aspect, the absorbing component comprises from 0.1 to about 3 mole percent ferric oxide, from about 0.1 to about 5 mole percent vanadium pentoxide, and from about 0.1 to about 2 mole percent titanium dioxide. In another aspect, the absorbing component comprises from about 1 to about 2 mole percent ferric oxide, from about 0.5 to about 2 mole percent vanadium pentoxide, and from about 0.1 to about 1 mole percent titanium dioxide.

In another aspect, the absorbing component comprises both the first and second aspects above, that is, the absorbing component has both the cupric oxide and ferric oxide/vanadium pentoxide/titanium dioxide absorbing components. In a further aspect, the absorbing component comprises from greater than 0 to about 25 mole percent cupric oxide, from greater than 0 to about 7 mole percent ferric oxide, from greater than 0 to about 10 percent vanadium pentoxide, and from 0 to about 5 mole percent titanium dioxide. In a further aspect, the absorbing glass comprises from about 4 to about 18 mole percent cupric oxide, from greater than 0 to about 3 mole percent ferric oxide, from greater than 0 to about 5 percent vanadium pentoxide, and from 0 to about 2 mole percent titanium dioxide. In a further aspect, the absorbing glass comprises from about 6 to about 16 mole percent cupric oxide, from about 0.1 to about 3 mole percent ferric oxide, from about 0.1 to about 5 percent vanadium pentoxide, and from about 0 to about 2, or about 0.1 to about 2 mole percent titanium dioxide. In a further aspect, the absorbing glass comprises from about 8 to about 14 mole percent cupric oxide, from about 1 to about 2 mole percent ferric oxide, from about 0.5 to about 2 mole percent vanadium pentoxide, and from 0 to about 1, or about 0.1 to about 1 mole percent titanium dioxide.

In another aspect, the glass portion of the frit comprises from about 5 to about 75 mole percent silicon dioxide, from about 10 to about 40 mole percent boron oxide, from 0 to about 20 mole percent aluminum oxide; and from greater than 0 to about 25 mole percent cupric oxide and/or the combination of from greater than 0 to about 7 mole percent ferric oxide, from greater than 0 to about 10 mole percent vanadium pentoxide, and from 0 to about 5 mole percent titanium dioxide.

In another aspect, the glass portion of the frit comprises from about 50 to about 75 mole percent silicon dioxide, from about 15 to about 30 mole percent boron oxide, from 0 to about 10 mole percent aluminum oxide; and from about 4 to about 18 mole percent cupric oxide and/or the combination of from about 0.1 to about 3 mole percent ferric oxide, from about 0.1 to about 5 mole percent vanadium pentoxide, and from 0 to about 2 mole percent titanium dioxide.

In another aspect the glass portion of the frit comprises from about 50 to about 75 mole percent silicon dioxide, from about 15 to about 30 mole percent boron oxide, from 0 to about 10 mole percent aluminum oxide; and from about 8 to about 14 mole percent cupric oxide and/or the combination of from about 1 to about 2 mole percent ferric oxide, from about 0.5 to about 2 mole percent vanadium pentoxide, and from 0 to about 1 mole percent titanium dioxide.

In another aspect, the glass portion of the frit comprises from about 54 to about 70 mole percent silicon dioxide, from about 19 to about 24 mole percent boron oxide, from 0 to about 10 mole percent aluminum oxide; and from about 4 to 18 mole percent cupric oxide and/or the combination of from about 0.1 to about 3 mole percent ferric oxide, from about 0.1 to about 5 mole percent vanadium pentoxide, and from 0 to about 2 mole percent titanium dioxide.

In another aspect, the glass portion of the frit comprises from about 54 to about 70 mole percent silicon dioxide, from about 19 to about 24 mole percent boron oxide, from 0 to about 10 mole percent aluminum oxide; and from about 8 to 14 mole percent cupric oxide and/or the combination of from about 1 to about 2 mole percent ferric oxide, from about 0.5 to about 2 mole percent vanadium pentoxide, and from 0 to about 1 mole percent titanium dioxide.

The frit of the present invention preferably absorbs radiation at a particular wavelength, for example 810 nanometers, more strongly than the first and second substrates. The selection of an appropriate absorbing component can be made so as to enhance absorption at the specific wavelength of the radiation source as compared to the substrates. Selection of appropriate absorbing components will allow the frit to soften and form a hermetic seal when radiation at the specific wavelength of the radiation source contacts and is absorbed by the frit.

In contrast, the substrates should be chosen such that they absorb substantially little or no radiation from the radiation source, minimizing the undesirable transfer of heat from the forming hermetic seal to the light emitting material. The temperature of OLED materials should typically be maintained at or below about 80-100° C. during the sealing process.

For the purposes of this invention, absorbance can be defined as follows:

$$\beta = -\log_{10}[T/(1-R)^2]/t,$$

wherein $\beta$ refers to the absorption coefficient, T refers to the fraction of light transmitted through thickness t, and R refers to reflectance.

The absorption coefficient of the frit should be greater than about 2/mm at the radiation wavelength. In one aspect, the absorption coefficient of the frit is at least about 4/mm. In a preferred aspect, the absorption coefficient of the frit is at least about 5/mm. Frits comprising iron, vanadium, and titanium can exhibit absorption coefficients as high as at least about 33/mm.

The frit should also have a CTE substantially similar to that of the first and second substrates to provide a durable hermetic seal and prevent cracks. In one aspect, the frit has a CTE of from about $10 \times 10^{-7}/°C$. below to about $5 \times 10^{-7}/°C$. above that of the first and second substrates. In a preferred aspect, the frit has a CTE of from about $3 \times 10^{-7}/°C$. below to about $3 \times 10^{-7}/°C$. above that of the first and second substrates. In one aspect, the frit does not require addition of other materials, such as fillers, to provide the CTE matching properties described above. Thus, the frit can have a substantially similar CTE to the substrates in the absence of a CTE matching filler. In a specific aspect, the frit is comprised of the metal oxides of silicon, boron, optionally aluminum, copper, iron, vanadium, and optionally titanium, without a CTE matching filler. In another aspect, the frit comprises a CTE matching filler.

The frit of the present invention can further comprise other materials to adjust the softening temperature, CTE, and/or absorbance of the frit composition. Such materials can include, for example, lithium oxide, sodium monoxide, potassium oxide, bismuth oxide, nickel oxide, manganese oxide, or a mixture thereof.

Preparation and Application of Frit

The glass portion of the frit can be formed by combining the desired base and absorbing components, heating the mixture to a temperature sufficient to melt the components, for example about 1,550° C., allowing the materials to mix, and subsequently cooling the resulting mixture. The resulting composition can be fractured by subjecting it to thermal shock, for example, by pouring cold water or liquid nitrogen over it. If necessary, the fractured pieces can be further crushed and milled to a desired particle size. In one aspect, fractured frit pieces are crushed to an approximate 325 mesh size and subsequently wet milled to an average particle size of approximately 1.9 micrometers.

A frit paste can then be formulated for dispensing onto a substrate by mixing the glass portion of the frit with other materials, such as a paste binder and/or paste filler to allow handling and dispensing of the frit paste. The paste binder and/or paste filler material utilized to make a frit paste is distinguished from the softening temperature, CTE, and/or absorbance adjusting filler referenced above. The selection of a paste binder or paste filler is dependent upon the desired frit paste rheology and application technique. Typically, a solvent is also added. In one aspect, the frit paste can comprise an ethylcellulose binder, such as T-100, available from Hercules, Inc. (Wilmington, Del., USA), and an organic solvent, such as TEXANOL®, available from Eastman Chemical Company (Kingsport, Tenn., USA). One of skill in the art could readily select appropriate paste binder, paste filler, and solvent for a particular application.

The frit paste can be applied to a substrate by any appropriate technique. In one aspect, a frit paste is applied using a MicroPen® dispensing device, available from OhmCraft, Inc., Honeoye Falls, N.Y., USA. In another aspect, a frit paste is applied using a screen-printing technique. The frit paste can be applied in any pattern suitable for sealing a device. For an OLED, the frit paste is typically applied in the form of a loop at or near the edge of the substrate.

Figure 2:
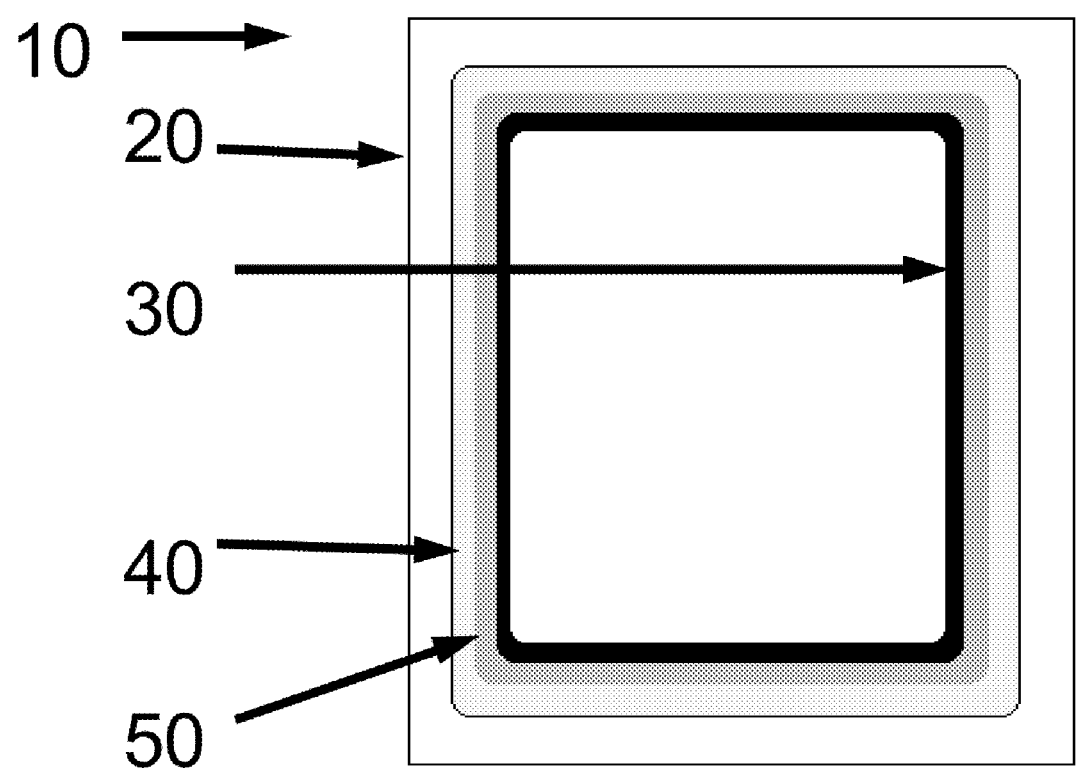
FIG. 2 is an illustration of an OLED device comprising a hermetic frit seal and a reinforcing epoxy loop in accordance with another aspect of the present invention.

In one aspect as depicted in FIG. 2, the frit paste can be applied in a form wider than the desired hermetic seal, wherein only the inner portion of the frit is heated and sealed. The unsealed portion of the frit can provide a thermal barrier between the sealed frit and the polymeric adhesive. In another aspect, additional frit paste can be applied in at least one location outside the periphery of the portion of the frit to be sealed.

Polymeric Adhesive

In the present invention, the polymeric adhesive provides improved mechanical strength to the seal between two substrates of a light emitting display device.

The polymeric adhesive can comprise any adhesive that can adhere to the substrates of a device, is dimensionally stable under typical processing and operating temperatures, and imparts mechanical strength to the device. The polymeric adhesive can be, for example, a cross-linkable polymer, a thermoplastic adhesive, a thermoset adhesive, an epoxy, a reactive adhesive, or a pressure sensitive adhesive.

In one aspect, the polymeric adhesive of the present invention is an acrylic adhesive. In one aspect, the polymeric adhesive is a methacrylate polymer. In another aspect, the polymeric adhesive of the present invention is an epoxy. Examples of epoxy resins that can be used in the present invention are resins derived from the following compounds: glycidyl ethers, such as glycidyl ethers of bisphenol A, bisphenol F, resorcinol, hydrogenated bisphenol A, polyglycidyl ethers of phenol novolak resins, cresol novolak resin, and other polyglycidyl ethers; glycidyl esters, such as glycidyl esters of phthalic acid, hexahydrophthalic acid, tetrahydrophthalic acid, and other glycidyl esters; glycidyl amines; linear aliphatic epoxides; hydantoin derivatives; and dimer acid derivatives.

It is preferable that the polymeric adhesive comprise an optically clear epoxy, such as TRA-BOND F113 or TRA-COAT 15D, available from TRA-CON, Inc., Bedford, Mass., USA., or NOA 61, available from Norland Products, Cranbury, N.J., USA.

The polymeric adhesive can be an adhesive that cures upon exposure to air, temperature, or radiation. In one aspect, the polymeric adhesive is a UV curable material. In another aspect, the polymeric adhesive is a thermally cured material.

The rheological properties of the polymeric adhesive should be selected based on the specific application. Polymeric adhesives are commercially available and one of skill in the art could readily select an appropriate polymeric adhesive.

The polymeric adhesive can be applied prior to, simultaneous with or subsequent to assembly and sealing of the device. In one aspect, as detailed in FIG. 1, the polymeric adhesive is applied in at least one location, for example, at or near a corner, outside the periphery of the frit loop. In another aspect, as detailed in FIG. 2, the polymeric adhesive is applied as a loop outside of and adjacent to the frit loop. In yet another aspect, the polymeric adhesive is applied in the form of a band around the perimeter or outer edge of the device, after assembly and sealing of the device. The polymeric adhesive can be applied in any number of discrete locations or as a continuous loop. The polymeric adhesive can be cured either prior to, simultaneous with, or subsequent to sealing the hermetic frit.

Sealing

A typical OLED includes an anode electrode, one or more organic layers and a cathode electrode. Initially, a frit, as described in U.S. Pat. No. 6,998,776, can be deposited along the edges of the second substrate. For instance, the frit can be placed approximately 1 mm away from the free edges of the second substrate. The compositions of several exemplary frits are provided below in Example 1.

The frit can be heated and attached to the second substrate. To accomplish this, the deposited frit is heated so that it becomes attached to the second substrate.

The frit can then be heated by a radiation source, such as a laser, in a manner so that the frit forms the hermetic seal connecting the first substrate to the second substrate. The hermetic seal also protects the OLED by preventing oxygen and moisture in the ambient environment from entering the OLED display. The hermetic seal is typically located just inside the outer edges of the OLED display. The frit can be heated using a variety of radiation sources such as a laser or an infrared lamp.

The frit can be applied to a substrate at any time prior to sealing the device. In one aspect, the frit is applied to a substrate and sintered to affix the frit to the substrate. The second glass substrate and the OLED material can be combined with the fritted sheet at a later time when the frit is heated to form a hermetic seal. In another aspect, frit can be applied to either the first or the second substrate at the time the device is fabricated and sealed. It should be noted that the above method is exemplary in nature and is not intended to be limiting.

Radiation Source for Sealing Frit

The radiation source of the present invention can be any radiation source which emits radiation at a wavelength corresponding to the absorbing component of the glass portion of the frit. For example, a frit comprising cupric oxide or a combination of ferric oxide, vanadium pentoxide, and titanium dioxide can be heated with a laser operating at 810 nanometers.

The laser can comprise additional optical components, such as a lens or a beamsplitter, to direct the laser beam onto the frit or both substrates. The laser beam can be moved in a manner to effectively heat and soften the frit, while at the same time minimizing heating of the substrates and the light emitting material.

It should be readily appreciated that depending on the optical properties of the particular frit and substrates, other types of lasers can be used which operate at different powers, different speeds and different wavelengths. However, the laser wavelength should be within the band of high absorption for the particular frit. One of skill in the art could readily select an appropriate laser for a particular frit.

The glass package and method of the present invention offer several advantages over the current practice in industry where an organic adhesive alone is used to provide a hermetic seal in a light emitting display. First, the light emitting display of the present invention does not require the presence of a desiccant. Second, the combination sealing system of the present invention provides the improved processing speed, long lasting hermetic seal, and inertness of a frit seal with the mechanical strength of a polymeric adhesive seal.

Although several aspects of the present invention have been illustrated in the accompanying drawings and described in the detailed description, it should be understood that the invention is not limited to the aspects disclosed, but is capable of numerous rearrangements, modifications and substitutions without departing from the spirit of the invention as set forth and defined by the following claims.

Examples

To further illustrate the principles of the present invention, the following examples are put forth so as to provide those of ordinary skill in the art with -a complete disclosure and description of how the glass compositions, articles, devices, and methods claimed herein are made and evaluated. They are intended to be purely exemplary of the invention and are not intended to limit the scope of what the inventors regard as their invention. Efforts have been made to ensure accuracy with respect to numbers (e.g., amounts, temperatures, etc.); however, some errors and deviations should be accounted for Unless indicated otherwise, temperature is ° C. or is at ambient temperature, and pressure is at or near atmospheric. There are numerous variations and combinations of process conditions that can be used to optimize product quality and performance. Only reasonable and routine experimentation will be required to optimize such process conditions.

Example 1

Frit Compositions (Glass Portions)

In a first example, a series of frit compositions were prepared comprising various combinations of components. The composition of each inventive sample is set forth in Table 3 below. All of the amounts detailed in Table 3 refer to mole percent.

TABLE 3

Glass Compositions

| Component | \\multicolumn{11}{c}{Sample (mole %)} |
|---|---|---|---|---|---|---|---|---|---|---|---|

| Component | A | B | C | D | E | F | G | H | I | J | K |
|---|---|---|---|---|---|---|---|---|---|---|---|
| SiO₂ | 62 | 65 | 59 | 56 | 68 | 68 | 57.5 | 12.7 | 10 | 0 | 0 |
| B₂O₃ | 22.5 | 22 | 20.5 | 22 | 22 | 22 | 27 | 28.4 | 30 | 0 | 0 |
| Al₂O₃ | 4 | 4 | 4 | 7 | 4 | 2 | 4 | 0 | 0 | 1.0 | 1.0 |
| CuO | 8 | 8 | 8 | 14 | 0 | 0 | 8 | 0 | 11 | 0 | 0 |
| Fe₂O₃ | 1.5 | 1 | 1.5 | 1 | 1.1 | 2 | 1.5 | 3.25 | 2 | 0 | 0 |
| TiO₂ | 0.5 | 0 | 0.5 | 0 | 0 | 0.5 | 0.5 | 0 | 0 | 1.0 | 1.0 |
| Li₂O | 1 | 0 | 1 | 0 | 0.8 | 0.5 | 1 | 0 | 0 | 0 | 0 |
| V₂O₅ | 0.5 | 0 | 0.5 | 0 | 1.1 | 2 | 0.5 | 3.25 | 2 | 47.5 | 46.6 |
| Na₂O | 0 | 0 | 0 | 0 | 3 | 3 | 0 | 0 | 0 | 0 | 0 |
| ZnO | 0 | 0 | 5 | 0 | 0 | 0 | 0 | 52.4 | 45 | 0 | 17.6 |
| K₂O | 0 | 0 | 0 | 0 | 0 | 0 | 0 | 0 | 0 | 0 | 0 |
| Sb₂O₃ | 0 | 0 | 0 | 0 | 0 | 0 | 0 | 0 | 0 | 23.5 | 7.4 |
| P₂O₅ | 0 | 0 | 0 | 0 | 0 | 0 | 0 | 0 | 0 | 27 | 26.5 |
| WO₃ | 0 | 0 | 0 | 0 | 0 | 0 | 0 | 0 | 0 | 0 | 0 |
| Bi₂O₃ | 0 | 0 | 0 | 0 | 0 | 0 | 0 | 0 | 0 | 0 | 0 |

The example compositions detailed in Table 3 above can substantially match the CTE of an Eagle glass substrate without addition of a CTE matching filler.

Example 2

Preparation of Inventive Glass Frit Powder

In a second example, a frit composition was prepared by combining the components of Inventive Sample A described in Table 3 above. The resulting mixture was heated to about 1,550° C. for approximately 6 hours to melt the components.

The hot glass mixture was subsequently fractured by pouring into cold water. The fractured glass pieces were crushed to 325 mesh and then wet milled to an average particle size of approximately 1.9 micrometers.

Example 3

Application of Frit Composition (Prophetic)

In a third example, a frit paste can be prepared for application to a substrate. Initially, a 2 wt. % binder solution can be prepared by dissolving a T-100 ethylcellulose binder, available from Hercules, Inc. (Wilmington, Del., USA) in TEX-ANOL®, an ester alcohol, available from Eastman Chemical Company (Kingsport, Tenn., USA). A frit paste can then be prepared by mixing the following components: 19.09 grams of the T-100/TEXANOL solution prepared above, 55.33 grams of the glass powder prepared in Example 2, and 0.61 grams of an OC-60 wetting agent, available from Dexter Chemical, L.L.C. (Bronx, N.Y., USA). The resulting frit paste can be dispensed onto an Eagle borosilicate glass substrate (Corning Inc., Corning, N.Y., USA), in a square pattern. The applied frit can then be sintered to the Eagle substrate at 700° C. for approximately 2 hours in a nitrogen environment.

Additional frit paste can be applied at the four corners of the device, external to the attached frit. Adjacent to the frit paste and at the corners of the device, an epoxy, such as TRA-BOND F113, available from TRA-CON, Inc., can be applied. The second glass substrate and OLED can subsequently be mated to the previously formed fritted sheet and sealed. The attached portion of the frit can be sealed using a laser while the unattached portion of the frit acts as a thermal barrier to the epoxy. The epoxy can then be cured using a UV radiation source.

Throughout this application, various publications are referenced. The disclosures of these publications in their entireties are hereby incorporated by reference into this application in order to more fully describe the compositions, articles, device, and methods described herein.

Various modifications and variations can be made to the compositions, articles, devices, and methods described herein. Other aspects of the compositions, articles, devices, and methods described herein will be apparent from consideration of the specification and practice of the compositions, articles, devices, and methods disclosed herein. It is intended that the specification and examples be considered as exemplary.

What is claimed is:

1. A glass package comprising:
    a first substrate,
    a second substrate,
    a sealed frit coupling the first substrate and the second substrate, and
    a polymeric adhesive further coupling the first substrate and the second substrate,
    wherein at least a portion of the first substrate is in overlying registration to at least a portion of the second substrate; and
    wherein the frit is made from glass doped with at least one transition metal and the frit does not comprise a coefficient of thermal expansion matching filler and an unsealed frit is disposed between the sealed frit and the polymeric adhesive.

2. The glass package of claim 1, wherein the sealed frit forms a sealed frit loop.

3. The glass package of claim 2, wherein the polymeric adhesive forms an adhesive loop positioned outside of the sealed frit loop.

4. The glass package of claim 1, wherein the polymeric adhesive is positioned in at least two discrete locations.

5. The glass package of claim 1, wherein the first substrate and/or the second substrate comprise corners, and wherein the polymeric adhesive is positioned at the corners.

6. The glass package of claim 1, further comprising a light emitting layer, wherein the sealed frit is positioned between the first and second substrates to form a sealed frit loop, and the light emitting layer is positioned between the first and second substrates and within the sealed frit loop.

7. The glass package of claim 6, wherein the light emitting layer comprises an organic light emitting diode.

8. The glass package of claim 1, wherein the polymeric adhesive comprises an epoxy.

9. The glass package of claim 1, wherein the first substrate and/or the second substrate comprise a borosilicate glass.

10. The glass package of claim 1, wherein the sealed frit is a hermetic seal between the first substrate and the second substrate.

11. A method of sealing a light emitting display device comprising:
   providing a light emitting layer, a first substrate and a second substrate, each substrate having an inner surface and an outer surface;
   depositing a frit around the perimeter of the inner surface of the first substrate;
   depositing a polymeric adhesive on the inner surface of at least one of the first or second substrate;
   joining the inner surfaces of the first substrate and the second substrate so that the light emitting layer is positioned between the first and second substrates, and so that at least a portion of the first substrate is in overlying registration with at least a portion of the second substrate;
   heating a first portion of the frit such that the first portion of the frit forms a hermetic seal between the first substrate and the second substrate and wherein a second portion of the frit is unsealed; and
   curing the polymer adhesive;
   wherein the heating and curing steps may be performed in any order.

12. The method of claim 11, wherein the heating step comprises a laser.

13. A method of sealing a light emitting display device comprising:
   providing a light emitting layer, a first substrate and a second substrate, each substrate having an inner surface and an outer surface;
   depositing a frit around the perimeter of the inner surface of the first substrate;
   joining the inner surfaces of the first substrate and the second substrate so that at least a portion of the first substrate is in overlying registration with at least a portion of the second substrate and so that the light emitting layer is positioned between the first and second substrate, thereby creating a joined first and second substrate;
   depositing a polymeric adhesive around the perimeter of the joined first and second substrates;
   heating a first portion of the frit such that the first portion of the frit forms a hermetic seal between the first substrate and the second substrate and wherein a second portion of the frit is unsealed; and
   curing the polymer adhesive;
   wherein the heating and curing steps may he performed in any order.

* * * * *